United States Patent
Tanaka et al.

(10) Patent No.: US 10,157,986 B2
(45) Date of Patent: Dec. 18, 2018

(54) SILICON CARBIDE SEMICONDUCTOR DEVICE AND METHOD FOR MANUFACTURING SAME

(71) Applicant: Mitsubishi Electric Corporation, Chiyoda-ku (JP)

(72) Inventors: Rina Tanaka, Tokyo (JP); Yasuhiro Kagawa, Tokyo (JP); Katsutoshi Sugawara, Tokyo (JP); Naruhisa Miura, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/560,204

(22) PCT Filed: Nov. 19, 2015

(86) PCT No.: PCT/JP2015/082482
§ 371 (c)(1),
(2) Date: Sep. 21, 2017

(87) PCT Pub. No.: WO2016/157606
PCT Pub. Date: Oct. 6, 2016

(65) Prior Publication Data
US 2018/0076285 A1 Mar. 15, 2018

(30) Foreign Application Priority Data

Mar. 30, 2015 (JP) .................. 2015-068036

(51) Int. Cl.
*H01L 29/78* (2006.01)
*H01L 29/10* (2006.01)
(Continued)

(52) U.S. Cl.
CPC ...... *H01L 29/1045* (2013.01); *H01L 21/0465* (2013.01); *H01L 29/0623* (2013.01);
(Continued)

(58) Field of Classification Search
CPC ............ H01L 29/1608; H01L 29/7813; H01L 29/1095; H01L 29/4236; H01L 29/7802;
(Continued)

(56) References Cited

U.S. PATENT DOCUMENTS

| | | | | |
|---|---|---|---|---|
| 6,570,185 B1 * | 5/2003 | Tan | ..................... | H01L 29/0619 257/329 |
| 7,427,800 B2 * | 9/2008 | Yilmaz | ............... | H01L 29/0619 257/488 |

(Continued)

FOREIGN PATENT DOCUMENTS

| | | |
|---|---|---|
| JP | 2001-267570 A | 9/2001 |
| JP | 2007-158275 A | 6/2007 |

(Continued)

OTHER PUBLICATIONS

International Search Report dated Jan. 12, 2016 in PCT/JP2015/082482, filed on Nov. 19, 2015.

*Primary Examiner* — Khiem D Nguyen
(74) *Attorney, Agent, or Firm* — Oblon, McClelland, Maier & Neustadt, L.L.P.

(57) ABSTRACT

A drift layer of a first conductivity type is made of silicon carbide. A body region of a second conductivity type is provided on the drift layer. A source region of the first conductivity type is provided on the body region. A source electrode is connected to the source region. A gate insulating film is provided on side and bottom surfaces of a trench which penetrates the body region and the source region. A gate electrode is provided in the trench with the gate insulating film interposed therebetween. A trench-bottom-surface protective layer of the second conductivity type provided below the bottom surface of the trench in the drift layer is electrically connected to the source electrode. The trench-bottom-surface protective layer has a high-concentration protective layer, and a first low-concentration pro- (Continued)

tective layer provided below the high-concentration protective layer and having an impurity concentration lower than that of the high-concentration protective layer.

13 Claims, 14 Drawing Sheets

(51) Int. Cl.
*H01L 21/04* (2006.01)
*H01L 29/66* (2006.01)
*H01L 29/739* (2006.01)
*H01L 29/06* (2006.01)
*H01L 29/16* (2006.01)

(52) U.S. Cl.
CPC .... *H01L 29/66068* (2013.01); *H01L 29/7397* (2013.01); *H01L 29/7813* (2013.01); *H01L 29/1608* (2013.01)

(58) Field of Classification Search
CPC ............ H01L 29/7395; H01L 29/1045; H01L 29/0623
See application file for complete search history.

(56) References Cited

U.S. PATENT DOCUMENTS

| | | | |
|---|---|---|---|
| 9,640,655 B2 | 5/2017 | Nishimura et al. | |
| 2008/0014702 A1* | 1/2008 | Kumar | H01L 29/66666 438/269 |
| 2009/0114969 A1* | 5/2009 | Suzuki | H01L 29/0619 257/301 |
| 2010/0193799 A1* | 8/2010 | Nakano | H01L 29/1608 257/77 |
| 2016/0005861 A1* | 1/2016 | Nishimura | H01L 29/66734 257/192 |
| 2016/0211334 A1* | 7/2016 | Tanaka | H01L 29/66068 |
| 2016/0329422 A1 | 11/2016 | Saito et al. | |
| 2017/0012121 A1 | 1/2017 | Saito et al. | |

FOREIGN PATENT DOCUMENTS

| | | | | |
|---|---|---|---|---|
| JP | 2010-219361 A | | 9/2010 | |
| JP | 2012-4458 A | | 1/2012 | |
| JP | 2015-46628 A | | 3/2015 | |
| JP | 2015-126085 A | | 7/2015 | |
| JP | 2015-126086 A | | 7/2015 | |
| WO | 2014/115280 A1 | | 7/2014 | |
| WO | WO-2014-115280 | * | 7/2014 | ............ H01L 29/78 |

* cited by examiner

F I G. 1
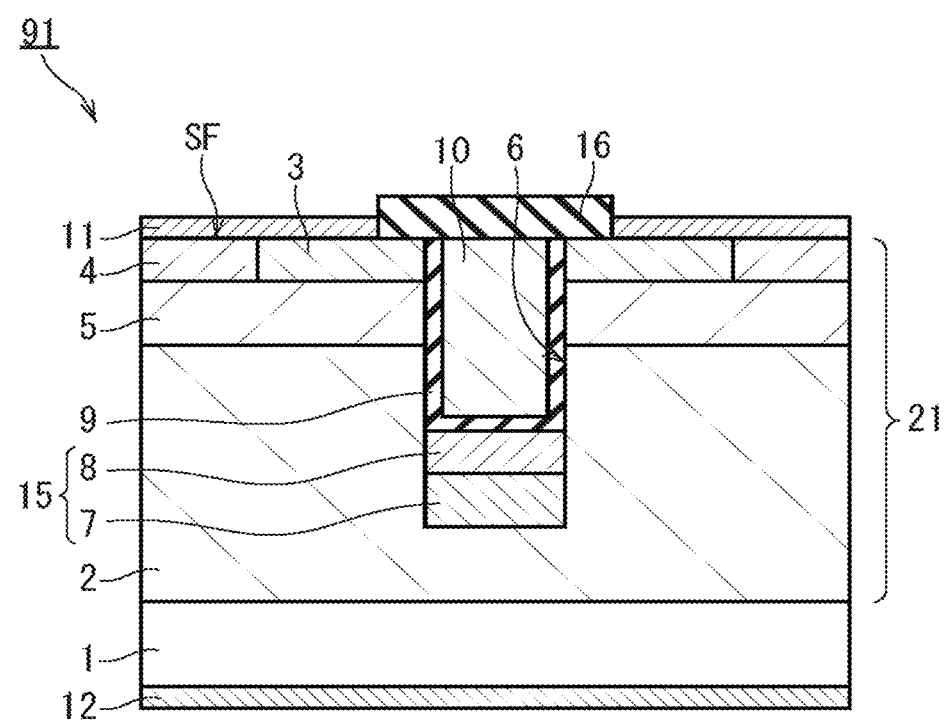

F I G. 3
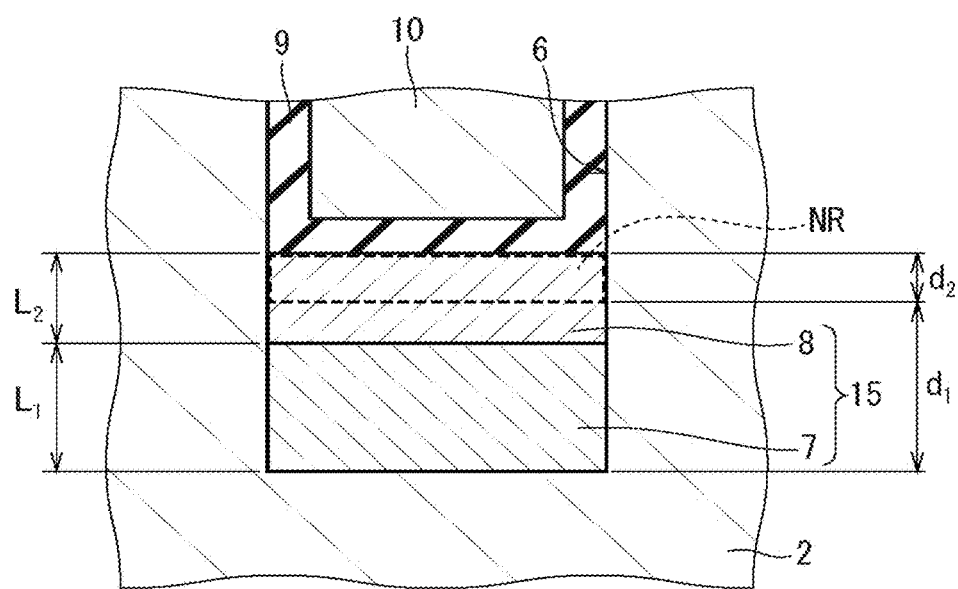

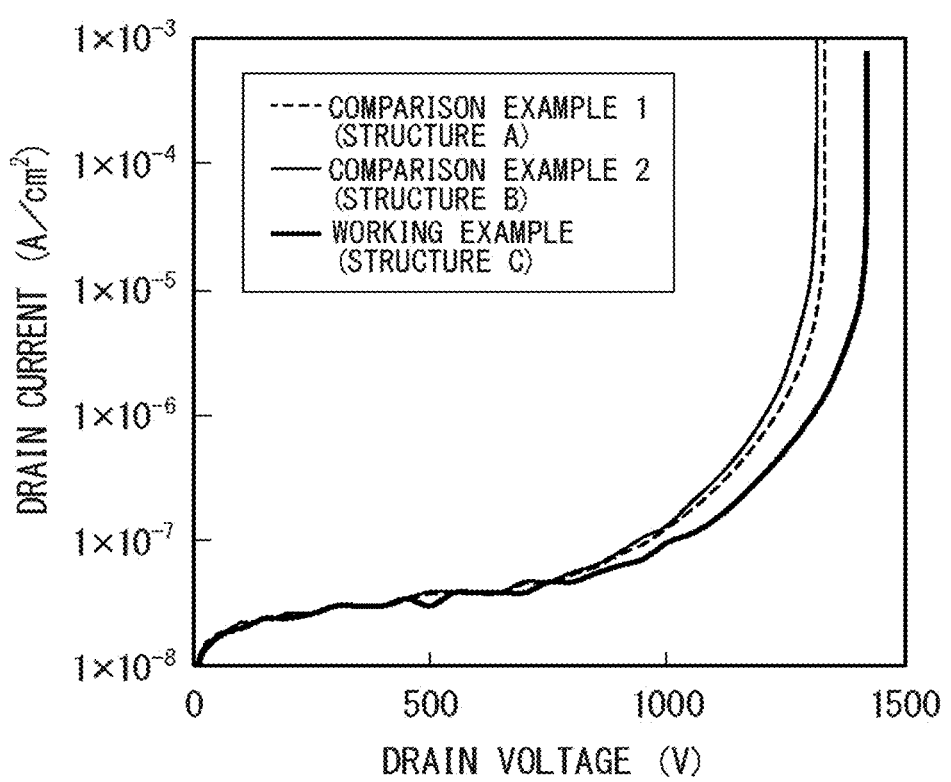
F I G. 13

F I G. 1 8
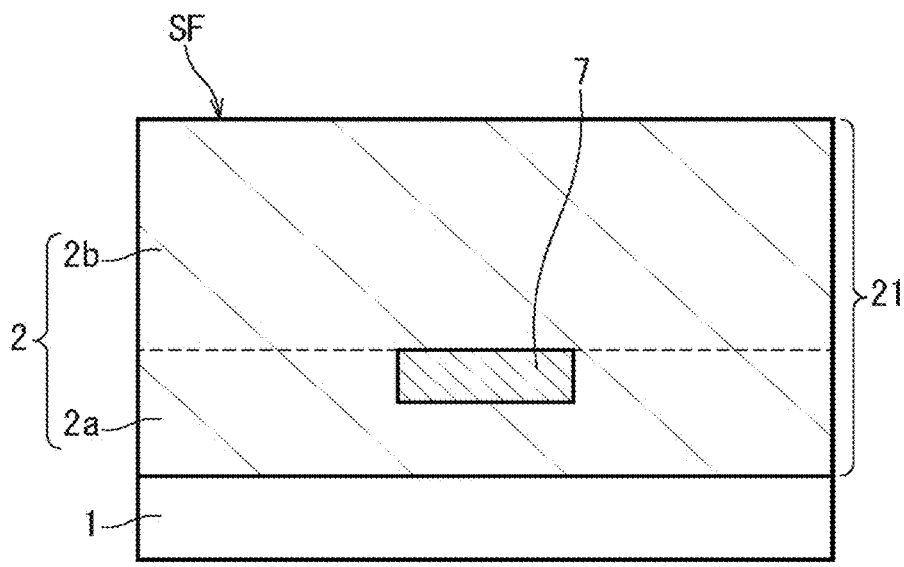
F I G. 1 9
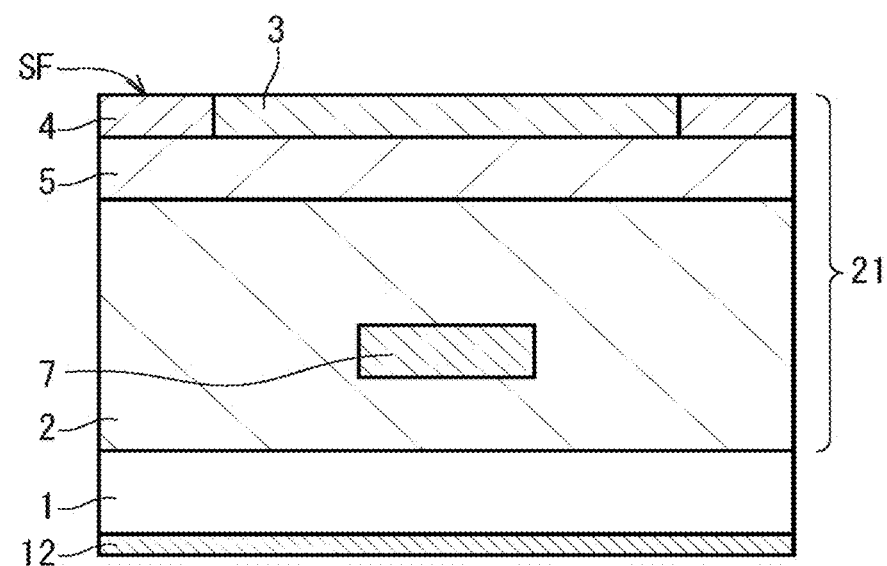

F I G. 2 0
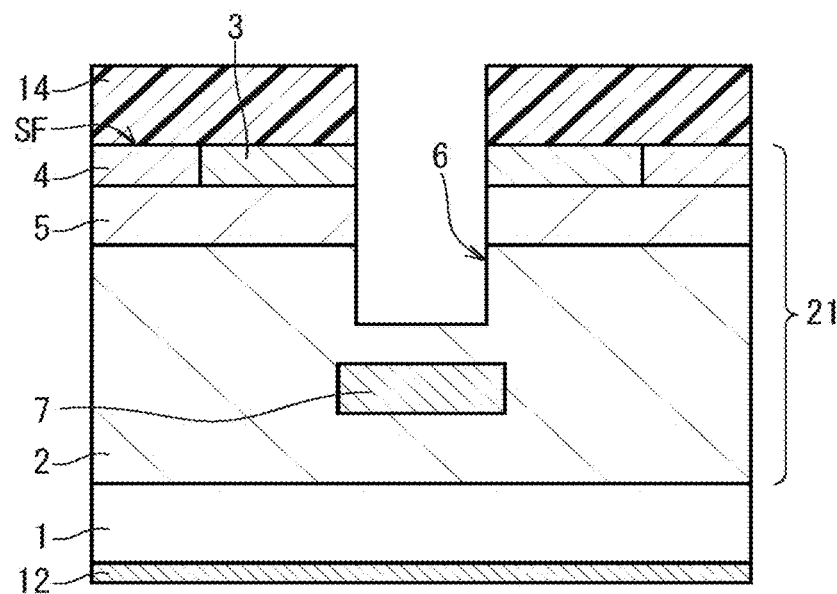
F I G. 2 1
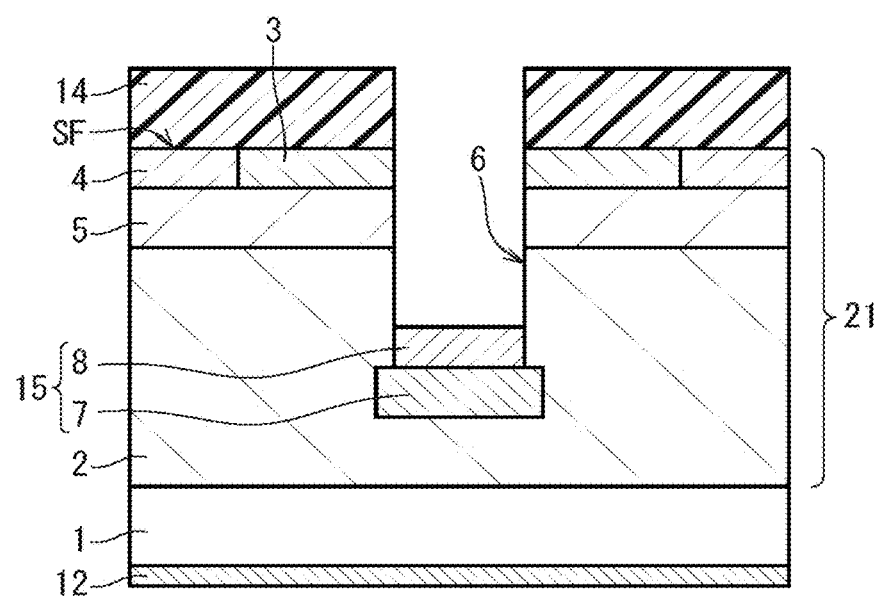

F I G. 2 2
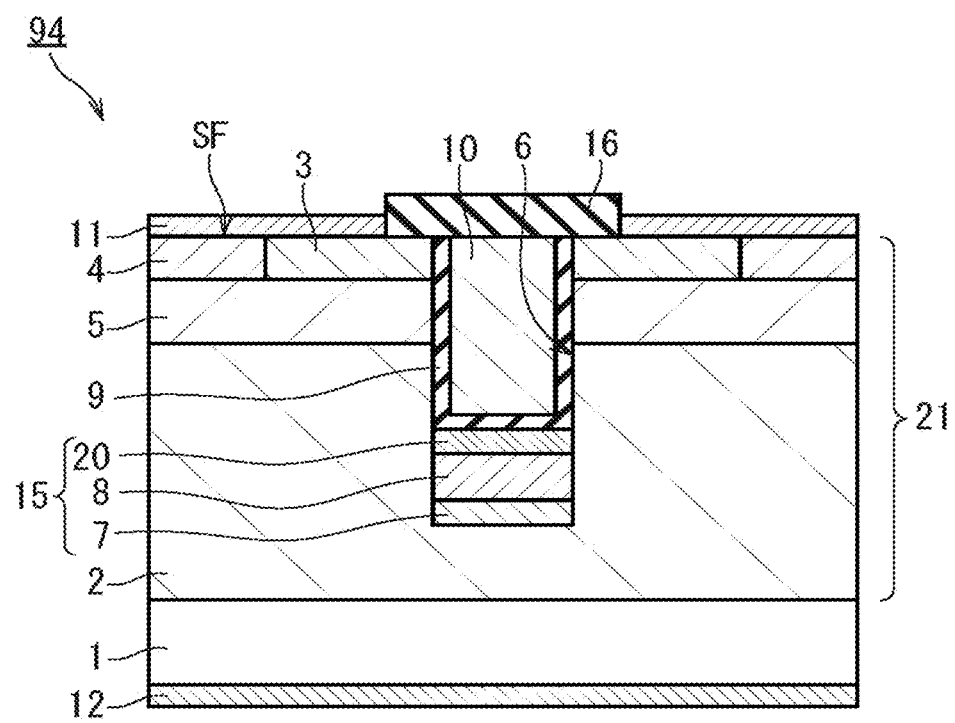

SILICON CARBIDE SEMICONDUCTOR DEVICE AND METHOD FOR MANUFACTURING SAME

TECHNICAL FIELD

The present invention relates to a silicon carbide semiconductor device and a method for manufacturing the same, and more particularly, to a trench gate type silicon carbide, semiconductor device and a method for manufacturing the same.

BACKGROUND ART

Insulated gate type semiconductor devices such as MOS-FET (Metal Oxide Semiconductor Filed Effect Transistor) and IGBT (Insulated Gate Bipolar Transistor) are widely used as a power switching element. In the insulated gate type semiconductor device, when a threshold voltage or more is applied to a gate electrode, a channel is formed in a body region, so that an on-state is obtained. Especially, when a trench gate type device is used, a channel width density is improved and a cell pitch can be reduced. Thus the device can be improved in performance such as a reduction in size or being able to be applied to a large current.

Meanwhile, a semiconductor device using silicon carbide (SiC) (hereinafter, referred to as the "silicon carbide semiconductor device") has drawn attention, and the trench gate type device has been further developed, as a next generation semiconductor device capable of realizing a high withstanding voltage and a low loss.

In the trench gate type semiconductor device, the problem is that when a high voltage is applied while the semiconductor device is in off state, an electric field concentrates on a trench bottom portion. Especially, in a case where SiC is used as semiconductor material, the electric field concentration on the trench bottom portion is likely to become the problem. The reason for this is that since the semiconductor material itself is high in dielectric breakdown strength, breakdown of a gate insulating film is likely to occur due to the electric field concentration on the trench bottom portion before avalanche breakdown occurs inside a drift layer. Therefore, a structure to relax the electric field concentration on the trench bottom portion has been studied.

For example, Japanese Patent Application Laid-Open No. 2001-267570 (Patent Document 1) discloses a trench gate type SiC-MOSFET which uses an n-type inversion layer as a channel. In an n-type layer, below a trench, a p-type electric field shield region is provided to shield an electric field from entering a gate oxide film from the n-type layer at the time of blocking a high voltage. According to the above document, it is supposed that due to this structure, the electric field strength can be relaxed at the gate oxide film portion, especially at the gate oxide film near a lower corner of the trench on which the electric field is likely to concentrate, so that the dielectric breakdown of the gate oxide film does not occur. Thus, it is supposed that a device withstanding voltage as high as insulation characteristics of SiC material can be obtained.

PRIOR ART DOCUMENTS

Patent Document

Patent Document 1: Japanese Patent Application Laid-Open No. 2001-267570

SUMMARY OF INVENTION

Problems to be Solved by the Invention

However, the inventors of the present invention have found from studies that it is not possible to obtain the high device withstanding voltage as high as the superior insulation characteristics of SiC material itself only by preventing the dielectric breakdown of the gate oxide film. More specifically, when the electric field shield region is designed only with a focus on preventing the dielectric breakdown of the gate oxide film, avalanche breakdown could be likely to occur due to a high electric field applied to a bottom surface of the electric field shield region. In this case, since the device withstanding voltage is limited by the avalanche breakdown voltage, the device withstanding voltage cannot be high enough to correspond to the superior insulation characteristics of SiC material itself.

The present invention was made to solve the above problems, and it is an object of the present invention to provide a silicon carbide semiconductor device having a high withstanding voltage, and a method for manufacturing the same.

Means for Solving the Problems

A silicon carbide semiconductor device in the present invention includes a first-conductivity-type drift layer made of silicon carbide, a second-conductivity-type body region provided on the drift layer, a first-conductivity-type source region provided on the body region, a source electrode connected to the source region, a gate insulating film provided on a side surface and a bottom surface of a trench penetrating the body region and the source region, a gate electrode provided in the trench with the gate insulating film interposed therebetween, and a second-conductivity-type trench-bottom-surface protective layer provided below the bottom surface of the trench in the drift layer and electrically connected to the source electrode. The trench-bottom-surface protective layer includes a high-concentration protective layer, and a first low-concentration protective layer provided below the high-concentration protective layer and having an impurity concentration lower than that of the high-concentration protective layer.

Effect of the Invention

According to the present invention, since the trench-bottom-surface protective layer includes the high-concentration protective layer having a high impurity concentration, the dielectric breakdown of the gate insulating film can be prevented from occurring at the trench bottom surface. Furthermore, since the trench-bottom-surface protective layer includes the low-concentration protective layer below the high-concentration protective layer, an avalanche breakdown voltage in off state can be increased. As a result, the device withstanding voltage can be high enough to correspond to the superior insulation characteristics of SiC itself.

The objects, features, aspects and advantages of the present invention will become more apparent from the following detailed description and the accompanying drawings.

BRIEF DESCRIPTION OF DRAWINGS

FIG. 1 is a partial cross-sectional view schematically showing a configuration of a silicon carbide semiconductor device in a first embodiment of the present invention.

FIG. 3 is a partial cross-sectional view showing respective thicknesses of a low-concentration protective layer and a high-concentration protective layer in FIG. 1, and respective thicknesses of a depletion layer and a non-depletion layer in the trench-bottom-surface protective layer.

FIG. 13 is a graph showing a relation between a drain voltage and a drain current in each of the structures A to C in FIGS. 12A to 12C.

FIG. 18 is a partial cross-sectional view schematically showing a second step in the method for manufacturing the silicon carbide semiconductor device in FIG. 16.

FIG. 19 is a partial cross-sectional view schematically showing a third step in the method for manufacturing the silicon carbide semiconductor device in FIG. 16.

FIG. 20 is a partial cross-sectional view schematically showing a fourth step in the method for manufacturing the silicon carbide semiconductor device in FIG. 16.

FIG. 21 is a partial cross-sectional view schematically showing a fifth step in the method for manufacturing the silicon carbide semiconductor device in FIG. 16.

FIG. 22 is a partial cross-sectional view schematically showing a configuration of a silicon carbide semiconductor device in a fourth embodiment of the present invention.

DESCRIPTION OF EMBODIMENTS

Figure 2A:
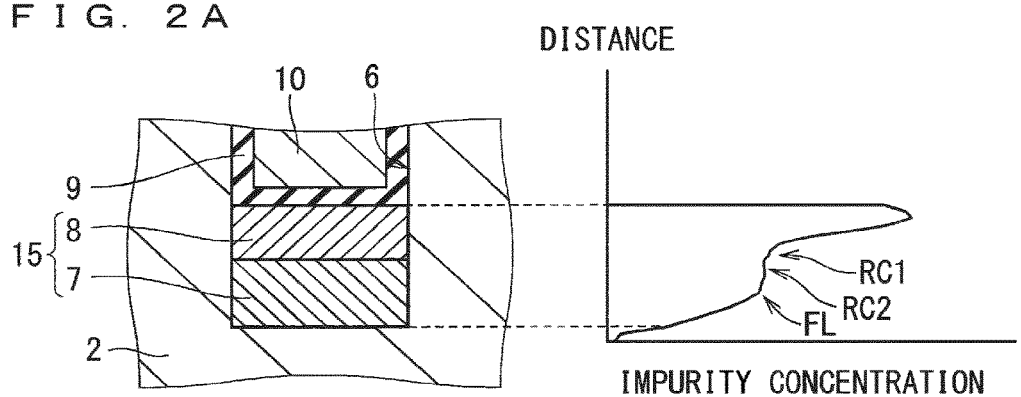
FIGS. 2A to 2C show examples of impurity concentration distributions of trench-bottom-surface protective layers in FIG. 1.

Hereinafter, the embodiments of the present invention will be described with reference to the drawings.

First Embodiment

FIG. 1 is a cross-sectional view schematically showing a cell configuration of an MOSFET 91 (silicon carbide semiconductor device) in this embodiment. The MOSFET 91 includes a substrate 1 (semiconductor substrate), a semiconductor layer 21, a gate oxide film 9 (gate insulating film), a gate electrode 10, a source electrode 11, a drain electrode 12, and an interlayer insulating film 16.

The substrate 1 is a silicon carbide semiconductor substrate of an n-type (a first conductivity type). A plane orientation of the substrate 1 may be any plane orientation such as (0 0 0 1) plane, (0 0 0 −1) plane, or (1 1 −2 0) plane. Furthermore, the plane orientation having an off-angle may be used.

The semiconductor layer 21 is made of silicon carbide. The semiconductor layer 21 is an epitaxial layer on the substrate 1. The semiconductor layer 21 includes a drift layer 2 of an n-type provided on the substrate 1, a body region 5 of a p-type (a second-conductivity-type different from the first-conductivity-type) provided on the drift layer 2, a source region 3 of an n-type provided on the body region 5, a body contact region 4 of a p-type provided on the body region 5, and a trench-bottom-surface protective layer 15 of a p-type. Each of the source region 3 and the body contact region 4 constitutes a part of a surface SF of the semiconductor layer 21.

In the surface SF of the semiconductor layer 21, a trench 6 which penetrates the source region 3 and the body region 5 and reaches the drift layer 2 is provided. Inner surfaces of the trench 6 include a side surface facing the body region 5, and a bottom surface being away from the body region 5 and facing the drift layer 2. A plane orientation of the side surface of the trench 6 may be any plane orientation such as (1 1 −2 0) plane, (1 −1 0 0) plane, or (0 3 −3 8) plane.

An n-type impurity concentration (dormer concentration) of the drift layer 2 is lower than that of the substrate 1. A p-type impurity concentration (acceptor concentration) of the body contact region 4 is higher than that of the body region 5. Furthermore, for current diffusion or suppression of extension of a depletion layer from the body region 5, a region having an n-type impurity concentration higher than the n-type impurity concentration of the drift layer 2 may be provided between a lower portion of the body region 5 and the drift layer 2.

The gate oxide film 9 covers the inner surfaces of the trench 6. The gate electrode 10 is formed on the inner surfaces of the trench 6 with the gate oxide film 9 interposed therebetween. In other words, the gate electrode 10 is formed on the gate oxide film 9 and embedded in the trench 6.

The interlayer insulating film 16 covers the gate electrode 10 disposed in the trench 6. The source electrode 11 is formed on the surface SF of the semiconductor layer 21 and is in contact with each of the source region 3 and the body contact region 4. The source electrode 11 has a portion made of silicide containing metal such as Ni or Ti on the semiconductor layer 21, whereby it forms an ohmic contact with each of the source region 3 and the body contact region 4. Thus, the source electrode 11 is connected to the source region 3 by ohmic contact. The drain electrode 12 is formed on a back surface of the substrate 1. The drain electrode 12 is a metal electrode made of Ni, for example.

Next, the trench-bottom-surface protective layer 15 will be described in detail below.

The trench-bottom-surface protective layer 15 is, in the drift layer 2, formed below a bottom surface of the trench 6. Specifically, the trench-bottom-surface protective layer 15 has a cover surface (an upper surface in the drawing) which covers the bottom surface of the trench 6, and a bottom surface (a lower surface in the drawing) opposite to the cover surface. The trench-bottom-surface protective layer 15 is formed on the drift layer 2 so as to be away from the body region 5 and in contact with the bottom surface of the trench 6. The trench-bottom-surface protective layer 15 is provided to relax an electric field at the bottom surface of the trench 6. In the semiconductor layer 21, at least the portion just below the bottom surface of the trench 6 is composed of the trench-bottom-surface protective layer 15. The trench-bottom-surface protective layer 15 is in contact with the gate oxide film 9 at the bottom surface of the trench 6.

The trench-bottom-surface protective layer 15 has a high-concentration protective layer 8 and a low-concentration protective layer 7 (a first low-concentration protective layer). The high-concentration protective layer 8 includes a portion at which the p-type impurity concentration of the trench-bottom-surface protective layer 15 takes a maximum value. The high-concentration protective layer 8 faces the bottom surface of the trench 6, and in this embodiment, it is in contact with the bottom surface of the trench 6. The low-concentration protective layer 7 is provided below the high-concentration protective layer 8 in the drawing, and specifically positioned on a bottom surface of the high-concentration protective layer 8. The low-concentration protective layer 7 constitutes at least a part of the bottom surface of the trench-bottom-surface protective layer 15. The low-concentration protective layer 7 has an impurity concentration lower than the maximum value of the impurity concentration in the high-concentration protective layer 8. The low-concentration protective layer 7 may have the impurity concentration lower than the impurity concentration in any position in the high-concentration protective layer 8 as shown in FIG. 2A, for example. The low-concentration protective layer 7 has a thickness equal to or larger than a thickness of the high-concentration protective layer 8. Furthermore, in this embodiment, the trench-bottom-surface protective layer 15 is composed of the high-concentration protective layer 8 and the first low-concentration protective layer 7. That is, the bottom surface of the high-concentration protective layer 8 is in contact with an upper surface of the first low-concentration protective layer 7, an upper surface of the trench-bottom-surface protective layer 15 corresponds to an upper surface of the high-concentration protective layer 8, and a bottom surface of the trench-bottom-surface protective layer 15 corresponds to a bottom surface of the low-concentration protective layer 7.

In this embodiment, the high-concentration protective layer 8 of the trench-bottom-surface protective layer 15 is a portion which has the impurity concentration higher than half of the maximum value of the p-type impurity concentration in the trench-bottom-surface protective layer 15. In this case, dimensions such as a width and the thickness of the high-concentration protective layer 8 correspond to dimensions of the above-mentioned region having the impurity concentration higher than half of the maximum value. In addition, in this case, the impurity concentration in the high-concentration protective layer 8 is more than or equal to twice as high as the impurity concentration in the low-concentration protective layer 7. In a case where the impurity concentration in the high-concentration protective layer 8 has a distribution, "the impurity concentration in the high-concentration protective layer 8" is defined by its maximum value. The low-concentration protective layer 7 is a portion positioned deeper than the high-concentration protective layer 8 in the trench-bottom-surface protective layer 15 and has the p-type impurity concentration lower than that at any position of the high-concentration protective layer 8. In a case where the impurity concentration in the low-concentration protective layer 7 has a distribution, "the impurity concentration in the low-concentration protective layer 7" is defined by its maximum value.

Figure 2B:
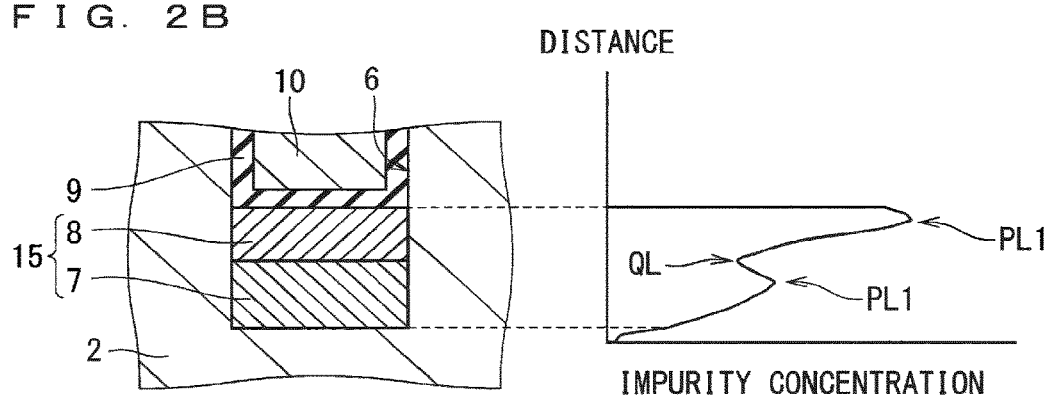
Figure 2C:
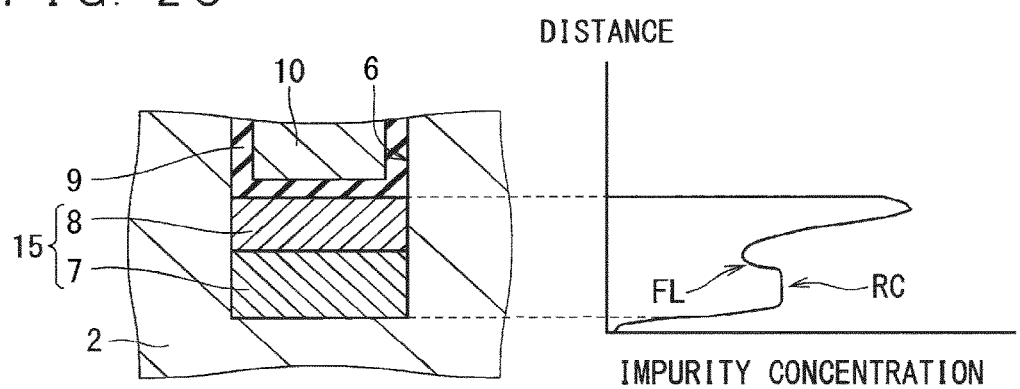

The trench-bottom-surface protective layer 15 has an impurity concentration profile in the thickness direction as shown in FIGS. 2A to 2C (a vertical direction in the drawings), for example. A desired impurity concentration profile will be described below.

As shown in FIG. 3, when $L_1$ represents the thickness of the low-concentration protective layer 7, and $L_2$ represents the thickness of the high-concentration protective layer 8, a thickness of the trench-bottom-surface protective layer 15 is equal to the sum of them, that is, $L_1+L_2$. In addition, $d_1$ represents a thickness of a depletion layer which extends from an interface between the low-concentration protective layer 7 and the drift layer 2 toward the trench-bottom-surface protective layer 15 when a reverse voltage corresponding to a withstanding voltage is applied to the MOSFET 91. Here, "the withstanding voltage" means a rated voltage described in specifications of a semiconductor device, for example. Furthermore, the withstanding voltage is determined by current-voltage characteristics when the semiconductor device is in off state, and it is a voltage when a leak current is sufficiently small. When $d_2$ represents a thickness of a non-depleted region NR which is a region not depleted, that is, a distance between an end of the depletion layer and the upper surface of the high-concentration protective, layer 8, it is satisfied that $L_1+L_2=d_1+d_2$. In other words, $d_2$ is defined such that $d_2=\{(L_1+L_2)-d_1\}$. It is desired that when a voltage around the withstanding voltage of the semiconductor device is applied, the low-concentration protective layer 7 is completely depleted and the high-concentration protective layer 8 is not completely depleted. That is, it is preferable that conditions $$d_1 > L_1, \text{ and } d_2 > 0$$

are satisfied.

The condition $d_2>0$ can be achieved by forming, near the bottom surface of the trench 6, the high-concentration protective layer 8 having the high impurity concentration with which complete depletion does not occur even when the MOSFET 91 is in off state. That is, the end of the depletion layer which extends in the trench-bottom-surface protective layer 15c an be away from the trench 6. Thus, electric field strength of the non-depleted region NR can be kept nearly zero except for a region close to the interface between the bottom surface of the trench 6 and the trench-bottom-surface protective layer 15, which is affected by a gate voltage. That is, the electric field can be prevented from reaching the vicinity of the trench 6. As a result, in the gate oxide film 9, the electric field strength can be sufficiently reduced in the portion near the bottom surface of the trench 6.

At the same time, when the low-concentration protective layer 7 formed below the high-concentration protective layer 8 has the sufficiently low impurity concentration to be completely depleted, that is, when the condition $L_1 < d_1$ is satisfied, the following effect can be provided.

When the MOSFET 91 is in off state, a high electric field is applied to the bottom surface of the trench-bottom-surface protective layer 15, that is, to the position of the bottom surface of the low-concentration protective layer 7. In other words, the high electric field is applied to a p-n junction between the trench-bottom-surface protective layer 15 and the drift layer 2. When the impurity concentration is low in the low-concentration protective layer 7 serving as the p-type region of the p-n junction, the electric field strength applied to the p-n junction can be kept low. Thus, an avalanche breakdown voltage can be improved. Furthermore, in on state, since the impurity concentration is low in the low-concentration protective layer 7 serving as the p-type region of the p-n junction, the depletion layer can be prevented from extending from the p-n junction interface into the drift layer 2 serving as the n-type region, that is, into a pathway of an on-current. Thus, an effect of preventing on-resistance from increasing can be provided.

The p-type impurity concentration of the low-concentration protective layer 7 is preferably $1.0 \times 10^{16}$ cm$^{-3}$ to $5.0 \times 10^{19}$ cm$^{-3}$. The p-type impurity concentration of the high-concentration protective layer 8 is preferably $1.0 \times 10^{17}$ cm$^3$ to $1.0 \times 10^{20}$ cm$^{-3}$. The n-type impurity concentration of the drift layer 2 is preferably $1.0 \times 10^{14}$ cm$^{-3}$ to $1.0 \times 10^{17}$ cm$^{-3}$ and this is set based on the withstanding voltage of the MOSFET 91. The p-type impurity concentration of the body region 5 is preferably $1.0 \times 10^{14}$ cm$^{-3}$ to $5 \times 10^{19}$ cm$^{-3}$. The n-type impurity concentration of the source region 3 is preferably $1.0 \times 10^{18}$ cm$^{-3}$ to $1.0 \times 10^{21}$ cm$^{-3}$. The p-type impurity concentration of the body contact region 4 is preferably $1.0 \times 10^{18}$ cm$^{-3}$ to $1.0 \times 10^{21}$ cm$^{-3}$, and this is set higher than that of the body region 5 in order to reduce contact resistance with the source electrode 11.

When the thickness (the distance $L_1$) of the low-concentration protective layer 7 is too small, or when the thickness (the distance $L_2$) of the high-concentration protective layer 8 is too large, the thickness (the distance $d_1$) of the depletion layer extending in the trench-bottom-surface protective layer 15 is reduced, so that the effect of improving the withstanding voltage is reduced. Thus, the thickness of the low-concentration protective layer 7 is preferably equal to or larger than the thickness of the high-concentration protective layer 8.

When the trench-bottom-surface protective layer 15 is electrically connected to the source electrode 11, its potential is fixed (grounded). This electric connection is made through an adjacent cell, for example. When the potential of the trench-bottom-surface protective layer 15 is fixed, the depletion layer spreads from the high-concentration protective layer 8 toward the drift layer 2 easily when the MOSFET 91 is turned off. Therefore, the effect of relaxing the electric field around the bottom surface of the trench 6 can be improved. That is, when the trench-bottom-surface protective layer 15 is grounded, the effect of relaxing the electric field of the gate oxide film 9 around the bottom surface of the trench 6 can be further improved. The grounding of the trench-bottom-surface protective layer 15 is preferably performed by grounding the high-concentration protective layer 8.

Furthermore, when the trench-bottom-surface protective layer 15 is grounded, capacitance generated between the gate and the trench-bottom-surface protective layer 15, and capacitance generated between the trench-bottom-surface protective layer 15 and the drain can be reduced. Thus, capacitance between the gate and drain can be reduced. As a result, switching speed of the MOSFET 91 increases, and a loss can be reduced. The SiC-MOSFET requires a high-speed switching operation in many cases, and in this case, the above merit is especially appreciated.

Figure 4:
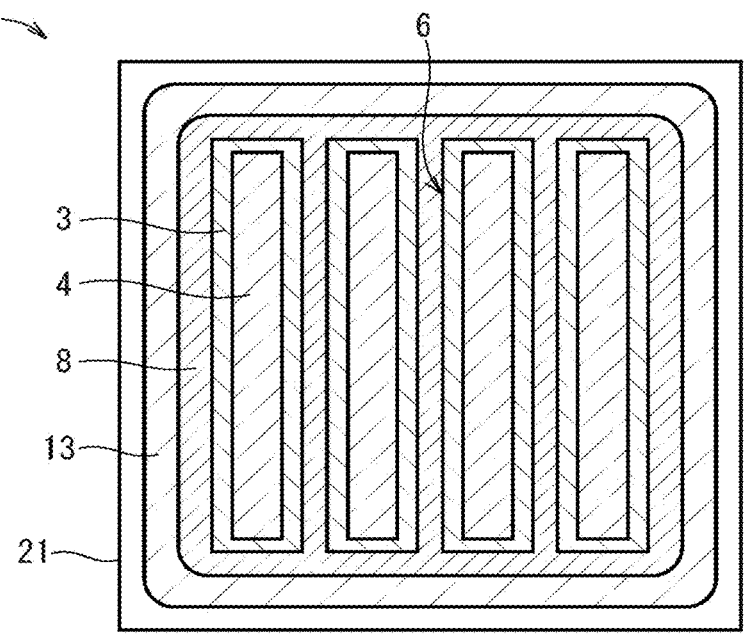
FIG. 4 is a plan view showing a first example of a pattern arrangement on a surface of a whole semiconductor layer in the silicon carbide semiconductor device in FIG. 1.
Figure 5:
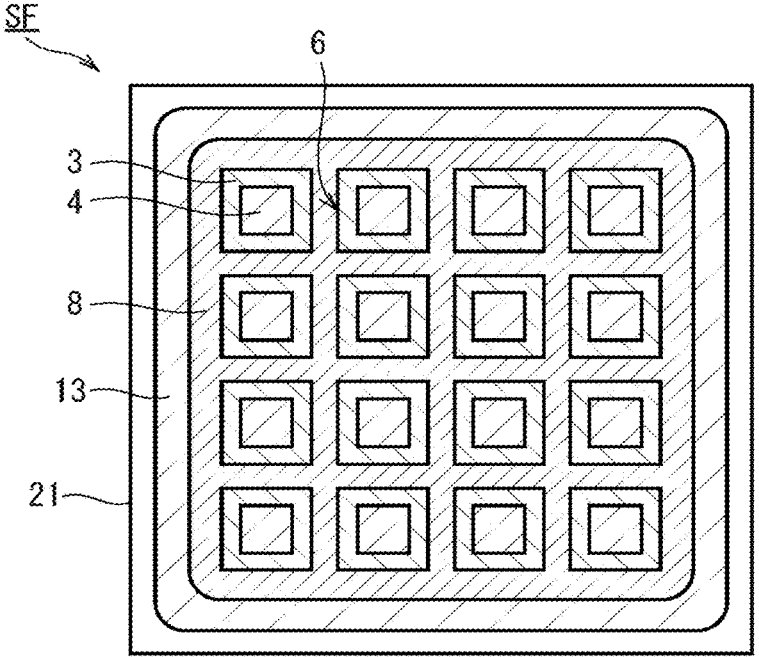
FIG. 5 is a plan view showing a second example of a pattern arrangement on a surface of a whole semiconductor layer in the silicon carbide semiconductor device in FIG. 1.

FIGS. 4 and 5 illustrate first and second examples of a pattern arrangement, respectively on the surface SF of the whole semiconductor layer 21. A planar arrangement of a cell structure in FIG. 1 can be formed into a stripe shape (FIG. 4) or lattice shape (FIG. 5). In addition, the cells are not necessarily aligned. In addition, the shape of cell is not limited to a square and may be another shape such as polygonal shape or shape with a corner having a curvature.

In FIGS. 4 and 5, the source region 3 and the body contact region 4 are formed into a stripe shape and an island shape, and the body region 5 (not shown in FIGS. 4 and 5) is formed below the source region 3 and the body contact region 4. The trench 6 is formed into a stripe shape or a lattice shape so as to be in contact with a side surface of the source region 3. Furthermore, the high-concentration protective layer 8 and the low-concentration protective layer 7 (not shown in FIGS. 4 and 5) are formed into the same pattern as the trench 6. An end region 13 is formed around the region having the cell. The end region 13 is a p-type impurity layer, for example. This impurity layer may be formed on the surface SF or may be formed on the bottom surface of the trench formed in the surface SF.

Next, an operation of the MOSFET 91 will be briefly described. When a voltage of a threshold voltage or more is applied to the gate electrode 10 (FIG. 1), an inversion layer serving as an n-type channel is formed in the body region 5 along the side surface of the trench 6. Thus, a current pathway having the same conductivity type is formed between the source electrode 11 and the drift layer 2. Thus, the MOSFET 91 is in on state. Meanwhile, when a voltage of the threshold voltage or less is applied to the gate electrode 10, the channel is not formed in the body region 5, so that the above-described current pathway is not formed. Therefore, even when a voltage is applied between the drain electrode 12 and the source electrode 11, a current hardly flows between them. That is, the MOSFET 91 is in off state. From the above, the on state and off state of the MOSFET 91 can be switched by controlling the voltage to be applied to the gate electrode 10.

Next, a method for manufacturing the MOSFET 91 will be described.

Figure 6:
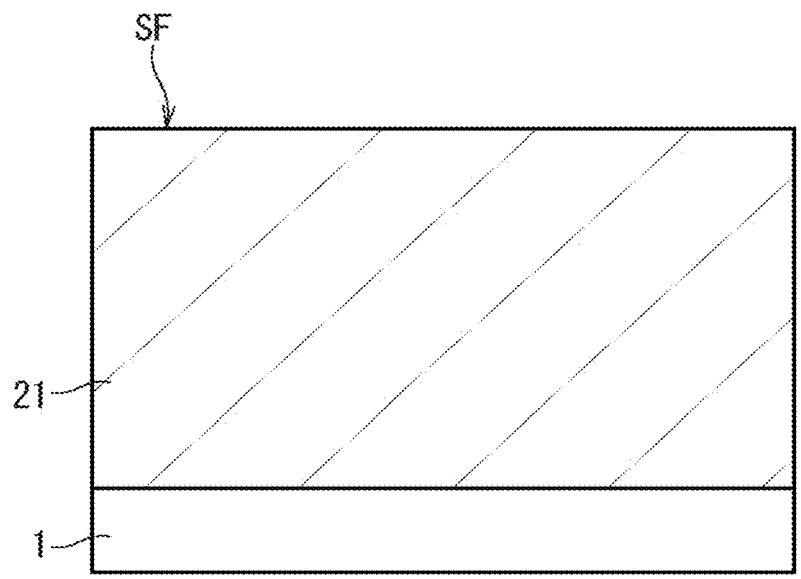
FIG. 6 is a cross-sectional view schematically showing a first step in a method for manufacturing the silicon carbide semiconductor device in FIG. 1.

Referring to FIG. 6, the semiconductor layer 21 supported by the substrate 1 is prepared. The semiconductor layer 21 can be formed on the substrate 1 by epitaxial growth. The n-type impurity concentration of the semiconductor layer 21 corresponds to the n-type impurity concentration of the drift layer 2 described above.

Figure 7:
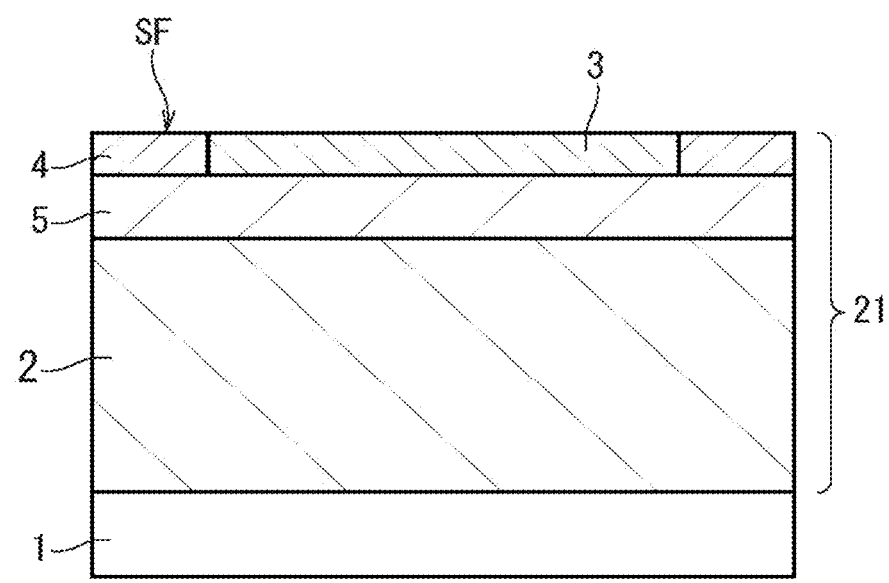
FIG. 7 is a cross-sectional view schematically showing a second step in the method for manufacturing the silicon carbide semiconductor device in FIG. 1.

Referring to FIG. 7, the source region 3, body contact region 4, and the body region 5 are formed in the upper part of the semiconductor layer 21 by ion implantation. Through this step, the source region 3 is formed on the surface of the body region 5. The rest of the semiconductor layer 21 is used as the drift layer 2. In the case where the n-type region is formed, N ions are implanted as donner ions, for example. In the case where the p-type region is formed, Al ions are implanted as acceptor ions, for example. The order of the steps of forming the regions is not limited in particular. Furthermore, the regions may be wholly or partially formed by epitaxial growth instead of the ion implantation.

Figure 8:
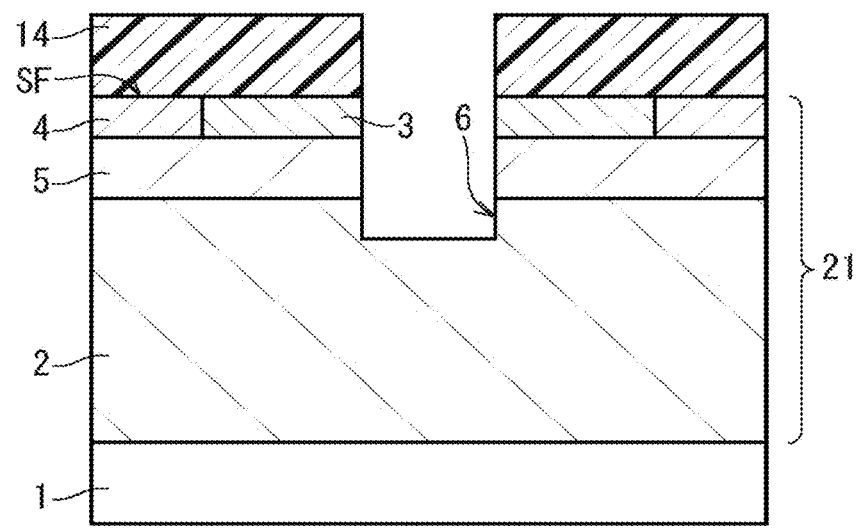
FIG. 8 is a cross-sectional view schematically showing a third step in the method for manufacturing the silicon carbide semiconductor device in FIG. 1.

Referring to FIG. 8, a mask 14 having an opening is formed on the semiconductor layer 21. Then, reactive ion etching (RIE) is performed with the mask 14. Thus, the trench 6 which penetrates the source region 3 and the body region 5 and reaches the drift layer 2 is formed in the surface SF. In other words, the trench 6 penetrates the body region 5 from the surface of the source region 3.

Figure 9:
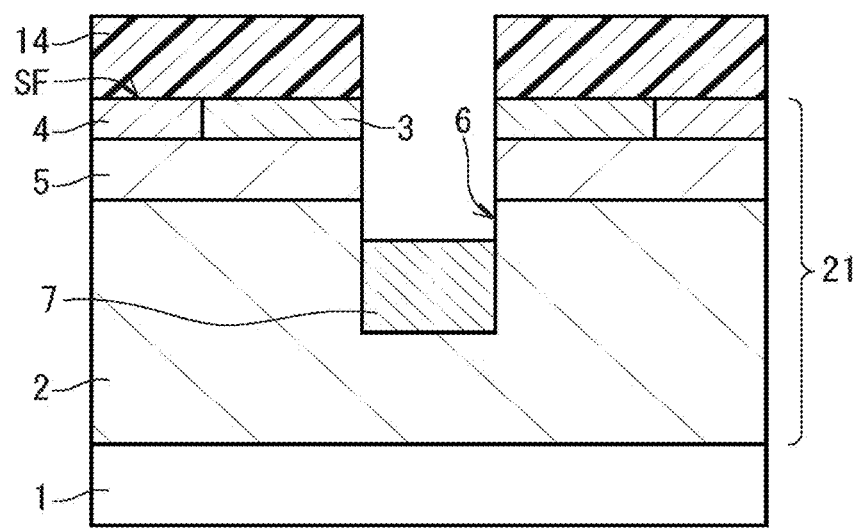
FIG. 9 is a cross-sectional view schematically showing a fourth step in the method for manufacturing the silicon carbide semiconductor device in FIG. 1.

Referring to FIG. 9, the low-concentration protective layer 7 is formed by selectively performing the p-type ion implantation at the bottom surface of the trench 6. The selective ion implantation can be performed with the mask 14. In addition, the method for forming the low-concentration protective layer 7 is not limited to the above method. For example, instead of the ion implantation, the epitaxial growth may be used. More specifically, the trench 6 is formed more deeply by the thickness of the low-concentration protective layer 7 to be formed, and then the low-concentration protective layer 7 is formed in the trench 6 by the epitaxial growth. Alternatively, the low-concentration protective layer 7 may be previously formed by the ion implantation or epitaxial growth in an embedded way when the semiconductor layer 21 is formed.

Figure 10:
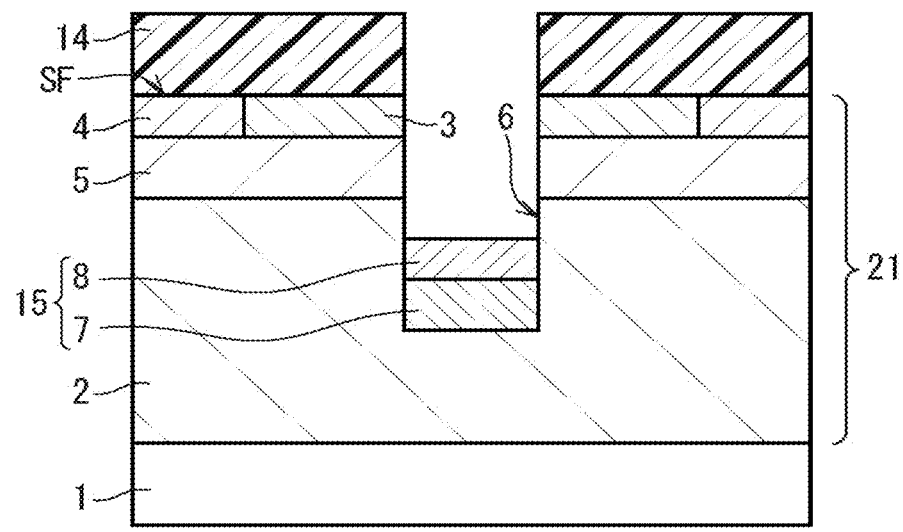
FIG. 10 is a cross-sectional view schematically showing a fifth step in the method for manufacturing the silicon carbide semiconductor device in FIG. 1.

Referring to FIG. 10, the high-concentration protective layer 8 is formed by implanting the p-type ions at the bottom surface of the trench 6 with a dose amount higher than that of the low-concentration protective layer 7. The ion implantation for forming the low-concentration protective layer 7, and the ion implantation for forming the high-concentration protective layer 8 are performed with different acceleration energies. As described above, the high-concentration protective layer 8, and the low-concentration protective layer 7 which is formed below the high-concentration protective layer 8 and has the impurity concentration lower than the impurity concentration of the high-concentration protective layer 8 are formed at the bottom surface of the trench 6 by performing the ion implantations several times with the different acceleration energies. In addition, instead of the ion implantation, an epitaxial growth condition may be adjusted. More specifically, the low-concentration protective layer 7 is formed at the bottom surface of the trench 6 by the epitaxial growth. Then, the high-concentration protective layer 8 having the impurity concentration higher than, the impurity concentration of the low-concentration protective layer 7 is formed on the upper surface of the low-concentration protective layer 7 by the epitaxial growth.

A diffusion coefficient of the impurity is low in the semiconductor layer 21 made of SiC, so that the impurity hardly diffuses. Thus, a concentration profile of the implanted impurity ions comes to a concentration profile in each region in the semiconductor layer 21. Therefore, in this embodiment, the two layers of the high-concentration protective layer 8 and the low-concentration protective layer 7 are formed by performing the multistage ion implantations with different energies, that is, performing the ion implantations two times or more with the different energies. Furthermore, three or more layers of concentration distributions may be formed by performing three or more multistage ion implantations.

The concentration distribution in the high-concentration protective layer 8 and the low-concentration protective layer 7 may be a step-shaped concentration distribution or continuously varying distribution. For example, the high-concentration protective layer 8 may have an impurity concentration peak in a depth direction, and the low-concentration protective layer 7 may have a peak in a depth direction smaller than the peak of the high-concentration protective layer 8. Furthermore, the peak in the low-concentration protective layer 7 may join to the peak in the high-concentration protective layer 8 to make a shoulder peak. Hereinafter, the concentration distributions of the high-concentration protective layer 8 and the low-concentration protective layer 7 will be described more specifically, using three examples (FIGS. 2A to 2C).

In the example in FIG. 2A, the high-concentration protective layer 8 includes at least one (one in the drawing) region RC1 in which the impurity concentration is constant in the depth direction. Furthermore, the low-concentration protective layer 7 includes at least one (one in the drawing) region RC2 in which the impurity concentration is smaller than that of the high-concentration protective layer 8 and constant in the depth direction. In another viewpoint, in this example, a shoulder peak of the impurity concentration of the low-concentration protective layer 7 exists on the tail of the peak of the impurity concentration of the high-concentration protective layer 8. In addition, in this example, a boundary between the high-concentration protective layer 8 and the low-concentration protective layer 7 may be defined by a middle point between the region RC1 and the region RC2.

In the example in FIG. 2B, the high-concentration protective layer 8 has a mountain-shaped peak PL1 of the impurity concentration in a depth direction. Furthermore, the low-concentration protective layer 7 has a mountain-shaped peak PL2 smaller than the mountain-shaped peak PL1 in a depth direction. Here, "the mountain-shaped peak" means a peak having a local maximum value unlike the regions RC1 and RC2 (FIG. 2A). In this case, a boundary between the high-concentration protective layer 8 and the low-concentration protective layer 7 may be defined by a depth point of a local minimum value QL.

As shown in FIG. 2A or 2C, an impurity concentration profile of the low-concentration protective layer 7 includes at least one (one in each drawing) gradient increase portion FL in which the magnitude of the gradient of the profile increases toward the depth direction. An increase or decrease of the impurity concentration in the gradient increase portion FL may be continuous as shown in the drawings, or step-shaped. Furthermore, as shown in FIG. 2C, the profile of the low-concentration protective layer 7 which has increased through the gradient increase portion FL may have a region RC in which the impurity concentration is constant in the depth direction. Instead of the region RC, the profile may have the mountain-shaped peak. In this example, a boundary between the high-concentration protective layer 8 and the low-concentration protective layer 7 may be defined by a start point of the gradient increase portion FL in the depth direction.

Referring to FIG. 1 again, after that, the gate oxide film 9 is formed to cover the inner surfaces of the trench 6. Subsequently, the gate electrode 10 is formed on the inner surfaces of the trench 6 with the gate oxide film 9 interposed therebetween. Then, the interlayer insulating film 16 is formed to cover the gate electrode 10. After that, the source electrode 11 is formed so as to be in contact with the surface of the source region 3 and the surface of the body contact region 4. In addition, the drain electrode 12 is formed on the back surface of the substrate 1. Through the above steps, the MOSFET 91 can be manufactured.

Figure 11:
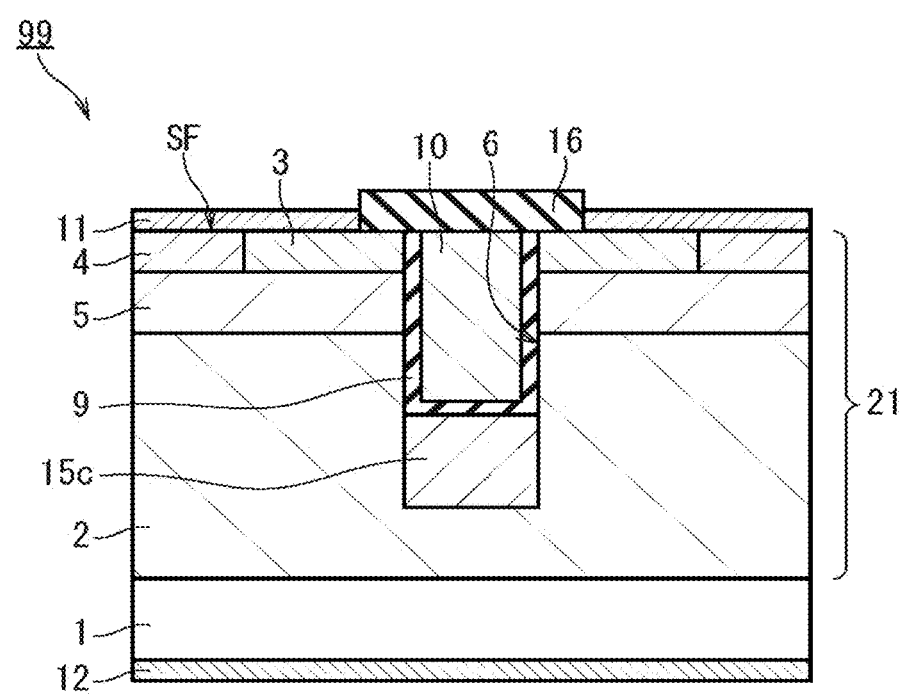
FIG. 11 is a partial cross-sectional view showing a configuration of a comparison example regarding FIG. 1.

Next, an effect of the MOSFET 91 (in FIG. 1) in this embodiment will be described, comparing with a MOSFET 99 in a comparison example (FIG. 11). As described above, the MOSFET 91 in this embodiment includes the low-concentration protective layer 7 formed below the high-concentration protective layer 8 and having the thickness equal to or larger than the thickness of the high-concentration protective layer 8. In other words, the trench-bottom-surface protective layer 15 in this embodiment has the two-layer structure composed of the high-concentration protective layer 8 below the trench 6 and the low-concentration protective layer 7 provided therebelow. Meanwhile, a trench-bottom-surface protective layer 15c of the MOSFET 99 in the comparison example has a substantially single-layer structure. The single-layer structure mentioned here may be a structure in which the low-concentration protective layer is provided below the high-concentration protective layer but the low-concentration protective layer only has a small thickness less than a thickness of the high-concentration protective layer, and only the high-concentration protective layer substantially constitutes the structure.

Figure 12A:
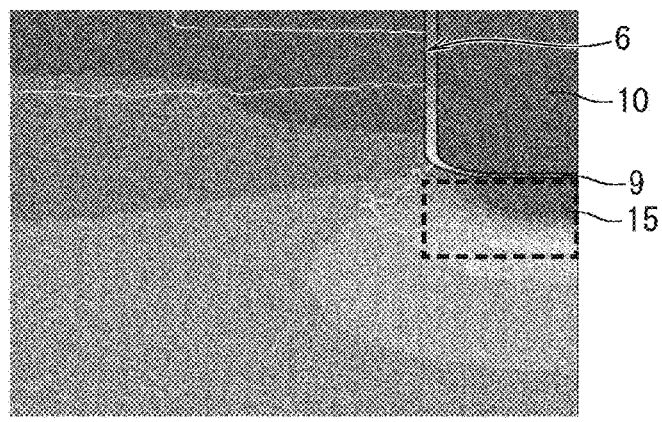
FIG. 12A is a contour view showing a simulation result of an electric field distribution in a structure A having a configuration in the comparison example in FIG. 11.
Figure 12B:
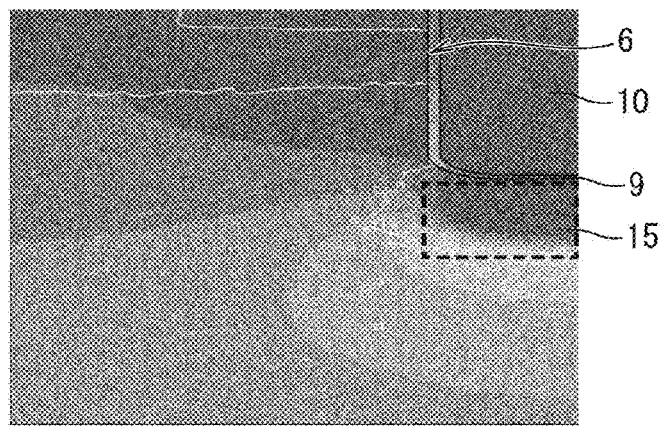
FIG. 12B is a contour view showing a simulation result of an electric field distribution in a structure B having the configuration in the comparison example in FIG. 11.
Figure 12C:
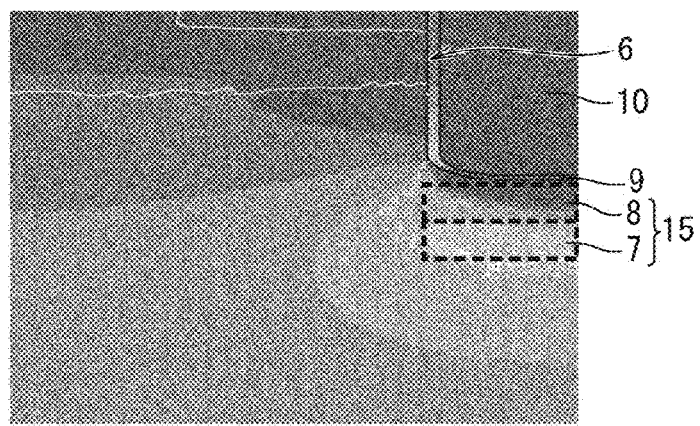
FIG. 12C is a contour view showing a simulation result of an electric field distribution in a structure C having the configuration in the embodiment in FIG. 1.

FIGS. 12A and 12B show simulation results of electric field distributions in off state, in structures A and B having the configuration of the MOSFET 99 in the comparison example, respectively. An impurity concentration of a trench-bottom-surface protective layer 15c in the structure B was set higher than a impurity concentration of the trench-bottom-surface protective layer 15c in the structure A. FIG. 12C shows a simulation result of an electric field distribution in off state in a structure C in a working example of the MOSFET 91 in this embodiment. An impurity concentration of the high-concentration protective layer 8 in the structure C was set higher than that of the trench-bottom-surface protective layer 15c in the structure B. In each drawing, a region from the surface of the semiconductor layer 21 to several μm below the trench-bottom-surface protective layer 15 is shown in a vertical direction, and a region from a center of the body contact region 4 to a center of the trench 6 is shown in a lateral direction. In the drawings, a more whitish region shows a region in which the electric field strength is higher, and a more blackish region shows a region in which the electric field strength is lower.

According to the structure A in the comparison example, it has been found that an especially high electric field is applied to both ends of the bottom surface of the trench 6 (corner parts of the trench 6), and to the gate oxide film 9 formed therein. The reason for this is thought to be due to the fact that an inside of the trench-bottom-surface protective layer 15c is depleted in the vertical direction and also depleted in the lateral direction to some degree, so that the corner parts of the trench 6 and the gate oxide film 9 formed therein are exposed to its depletion layer. Furthermore, it has been found that the electric field concentrates on the bottom surface of the trench-bottom-surface protective layer 15c. Specifically, in the structure A, a maximum electric field strength in the gate insulating film 9 was 3.8 MV/cm, and a maximum electric field strength at the bottom surface of the trench-bottom-surface protective layer 15c was 3.2 MV/cm. The electric field is likely to concentrate on the above portions while a high voltage is applied.

According to the structure B in the other comparison example, the electric field concentrated on the above portions similarly, but a high electric field did not enter the vicinity of the trench 6. The reason for this is thought to be due to the fact that since the impurity concentration of the trench-bottom-surface protective layer 15c is high, an area of the bottom surface of the trench 6 is largely covered with a low electric field region which has not been depleted, so that an, end of a depletion layer is away from the bottom surface of the trench 6. On the other hand the electric field strength at the bottom surface of the trench-bottom-surface protective layer 15c was higher than that in the structure A. The reason for this is thought to be due to the fact that a thickness of the depletion layer formed in the trench-bottom-surface protective layer 15c is small. Specifically, in the structure B, a maximum electric field strength in the gate insulating film 9 was 2.5 MV/cm, and a maximum electric field strength at the bottom surface of the trench-bottom-surface protective layer 15c was 3.3 MV/cm.

Meanwhile, according to the structure C in the working example, electric field strengths at the corner portions of the trench 6 and at the gate oxide film 9 were kept almost as low as that in the structure B. The reason for this is thought to be due to the fact that since the impurity concentration of the high-concentration protective layer 8 which covers the bottom surface of the trench 6 is high, an area of the bottom surface of the trench 6 is largely covered with a low electric field region which has not been depleted. At the same time, an electric field strength at the bottom surface of the trench-bottom-surface protective layer 15 was smaller than that in the structure A. The reason for this is thought to be due to the fact that the low-concentration protective layer 7 constituting the bottom surface side of the trench-bottom-surface protective layer 15 has the low impurity concentration and has the thickness equal to or larger than the thickness of the high-concentration protective layer 8, so that about half of the trench-bottom-surface protective layer 15 is depleted. Specifically, in the structure C, a maximum electric field strength in the gate insulating film 9 was 2.8 MV/cm, and a maximum electric field strength at the bottom surface of the trench-bottom-surface protective layer 15 was 3.0 MV/cm.

FIG. 13 shows a graph of current/voltage characteristics in off state in the structures A to C. As for a leak voltage of the MOSFET found from this graph, a leak voltage in the structure A in the comparison example was 1330 V. Here, the "leak voltage" means a voltage provided when a certain leak current flows, in the current/voltage characteristics in off state. As the leak voltage becomes high, the withstanding voltage of the semiconductor device can be improved. A leak voltage in the structure B in the comparison example having the higher impurity concentration in the trench-bottom-surface protective layer 15c was about the same as 1320 V. Meanwhile, a leak voltage in the structure C in the working example was 1420 V, which was higher than the above. The reason for this is thought to be due to the fact that in the structure C, the effect of relaxing the electric field can be highly kept at the gate oxide film 9 because of the high-concentration protective layer 8, while the avalanche breakdown voltage is increased because of the low-concentration protective layer 7. The reason why the avalanche breakdown voltage is improved is that since the low-concentration protective layer 7 having the relatively low impurity concentration is disposed on the bottom surface side of the trench-bottom-surface protective layer 15, the depletion is promoted at the bottom surface of the trench-bottom-surface protective layer 15, so that the electric field strength is lowered at the p-n junction between the trench-bottom-surface protective layer 15 and the drift layer 2.

The above results are summarized as follows.

TABLE 1

|  | Maximum electric field strength in gate insulating film | Maximum electric field strength at p-n junction | Leak voltage |
| --- | --- | --- | --- |
| Structure A | 3.8 MV/cm | 3.2 MV/cm | 1330 V |
| Structure B | 2.5 MV/cm | 3.3 MV/cm | 1320 V |
| Structure C | 2.8 MV/cm | 3.0 MV/cm | 1420 V |

In order to improve the withstanding voltage by heightening the leak voltage, it needs to reduce the maximum electric field strength to be applied to the gate oxide film 9 and the maximum electric field strength at the p-n junction in well-balanced manner. That is, the maximum electric field strength at the gate oxide film 9 and the maximum electric field strength at the p-n junction are in a trade-off relation. Specifically, when the concentration in the trench-bottom-surface protective layer 15 is wholly low as in the structure A, the maximum electric field strength, to be applied to the gate oxide film 9 is increased. Meanwhile, when the concentration in the french-bottom-surface protective layer 15 is wholly high as in the structure B, the maximum electric field strength at the p-n junction is increased. As a result, the withstanding voltage is low in each case of the structures A and B. Meanwhile, according to the structure C, both of them can be reduced, so that the trade-off relation can be improved.

When the MOSFET 91 is in off state, a high voltage is applied between the gate electrode 10 and the drain electrode 12. This high voltage is partially borne by the semiconductor layer 21 and the gate oxide film 9. When it is assumed that the semiconductor layer 21 is made of Si, the electric field strength in the semiconductor layer 21 reaches a dielectric breakdown strength of the semiconductor material itself before the high electric field is applied to the gate oxide film 9. Therefore, it is not highly necessary to reduce the electric field at the gate oxide film 9. Meanwhile, in the case where SiC, which has the high dielectric breakdown strength, is used as in this embodiment, when the electric field strength in the semiconductor layer 21 reaches the dielectric breakdown strength of the semiconductor material itself, a high electric field is applied to the gate oxide film 9. Therefore, it is necessary to reduce the electric field to be applied to the gate oxide film 9. According to this embodiment, as described above, the electric field at the gate oxide film 9 can be sufficiently reduced, and the electric field strength in SiC can be reduced, so that the withstanding voltage can be improved.

In conclusion, according to this embodiment, since the trench-bottom-surface protective layer 15 has the high-concentration protective layer 8, the dielectric breakdown of the gate oxide film 9 can be prevented from occurring at the bottom surface of the trench 6. Furthermore, since the trench-bottom-surface protective layer 15 has the low-concentration protective layer 7 below the high-concentration protective layer 8, the avalanche breakdown voltage in off state can be heightened. As a result, the high withstanding voltage corresponding to the excellent insulating characteristic of SiC itself can be obtained.

Furthermore, in a case where some current flows in the trench-bottom-surface protective layer 15, a voltage drop may occurs due to resistance of the trench-bottom-surface protective layer 15. During the switching operation, due to depletion electric charge in the depletion layer extending along the p-n junction between the trench-bottom-surface protective layer 15 and the drift layer 2, the current flows in the trench-bottom-surface protective layer 15 and the voltage drop occurs. This voltage drop becomes sharp as the resistance of the trench-bottom-surface protective layer 15 is increased. Because of a potential difference due to the voltage drop, the electric field is applied to the gate oxide film 9 at the bottom surface of the trench 6, which could lower reliability of the gate oxide film 9.

According to this embodiment, since the high-concentration protective layer 8 is provided, the resistance of the trench-bottom-surface protective layer 15c an be reduced, so that the electric field to be applied to the gate oxide film during the switching operation can be reduced, and the reliability of the gate oxide film 9 can be prevented from being lowered. Furthermore, since the low-concentration protective layer 7 is provided, the avalanche breakdown voltage can be prevented from being lowered. That is, according to this embodiment, the reliability of the gate oxide film 9 during the switching operation can be established, and the reliability of the gate oxide film 9 and the avalanche breakdown voltage characteristics during the stationary off state can be established.

Furthermore, in the case where the trench-bottom-surface protective layer 15 is electrically connected to the source region 3, compared with a case where the trench-bottom-surface protective layer 15 is in an electrically floating state, the current generated during the switching operation flows toward the source region 3, and the current flowing in the trench-bottom-surface protective layer 15 is especially increased, so that the above merit can become conspicuous.

Furthermore, according to this embodiment, an effect of improving short circuit tolerance can be obtained. In the case where SiC is used, its short circuit tolerance is lower than that of Si, so that the improvement in short circuit tolerance is regarded as one of important issues. For example, in a case where a load short circuit occurs, an overcurrent flows in an on-current pathway, so that the semiconductor device is broken down, and in this case, the short circuit tolerance is represented by a time from when the load short circuit occurs until when the semiconductor device is broken down. When the overcurrent flows in the semiconductor device, the semiconductor device is raised to high temperature, and SiC and the gate oxide film 9 are broken down, so that to improve the short circuit tolerance, it is effective to reduce the overcurrent at the time of short circuit.

According to this embodiment, since the high-concentration protective layer 8 is provided in the trench-bottom-surface protective layer 15, the depletion layer can largely extend from the trench-bottom-surface protective layer 15 to the drift layer 2. Therefore, the resistance of the pathway in which the current flows at the time of short circuit is increased, so that the overcurrent can be reduced at the time of short circuit. As a result, the short circuit tolerance can be improved. That is, according to this embodiment, the effect of improving the short circuit tolerance can be obtained, and especially, the merit of improving the short circuit tolerance can be provided even when SiC is used.

In addition, since the ion implantations for forming the low-concentration protective layer 7 and the high-concentration protective layer 8 are performed after the trench has been formed, a depth of the ion implantation from the surface SF of the semiconductor layer 21 can be reduced by the depth of the trench 6. Accordingly, energy at the time of implantation can be low, and a defect is prevented from being caused by the implantation. As a result, the quality of the interface between the gate oxide film 9 and the semiconductor layer 21 can be improved. Thus, the leak current can be prevented, for example.

In addition, according to this embodiment, the ion implantations are performed at the bottom surface of the trench 6 to form the low-concentration protective layer 7 and the high-concentration protective layer 8 at the lower portion of the trench 6 in the drift layer 2, that is, at least just below the trench 6, but the low-concentration protective layer 7 and the high-concentration protective layer 8 may be formed by performing the ion implantations from the surface SF of the semiconductor layer 21 before the trench 6 is formed. In this case, the low-concentration protective layer 7 and the high-concentration protective layer 8 can be also formed outside the side surface of the trench 6.

Second Embodiment

Figure 14:
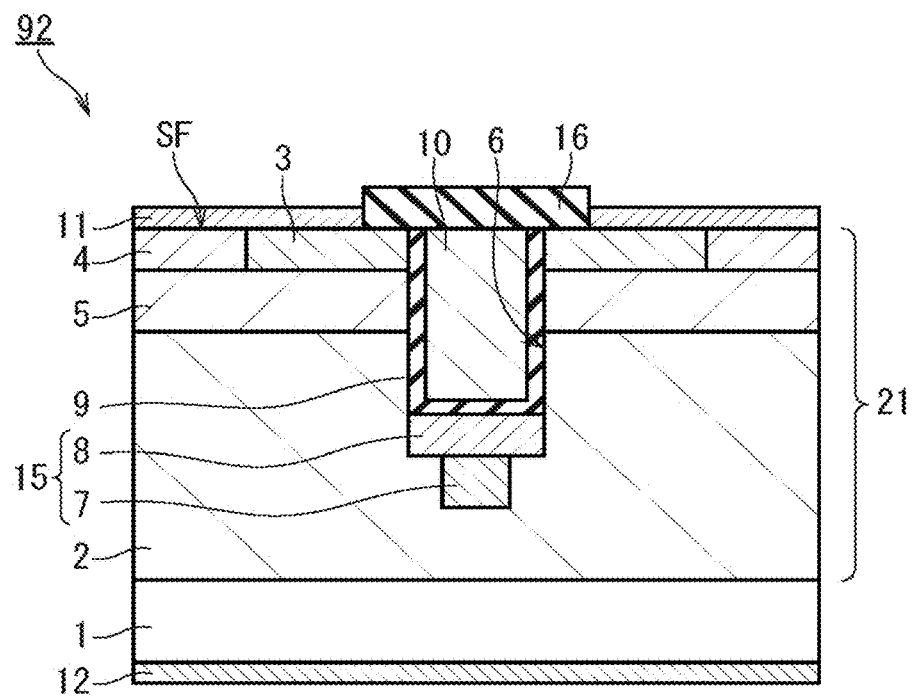
FIG. 14 is a partial cross-sectional view schematically showing a configuration of a silicon carbide semiconductor device in a second embodiment of the present invention.

FIG. 14 shows a schematic cross-sectional view of a cell configuration of an MOSFET 92 (silicon carbide semiconductor device) in this embodiment. In this embodiment, compared with the first embodiment, a configuration of the trench-bottom-surface protective layer 15 is different. Specifically, as for the trench-bottom-surface protective layer 15 of the MOSFET 92, a width of the low-concentration protective layer 7 is smaller than a width of the high-concentration protective layer 8. Therefore, the low-concentration protective layer 7 constitutes only a part of the bottom surface of the trench-bottom-surface protective layer 15 (center of the bottom surface in the drawing), and the high-concentration protective layer 8 constitutes the other part of the bottom surface of the trench-bottom-surface protective layer 15 (both ends of the bottom surface in the drawing). Since the configuration other than the above is almost the same as the configuration of the first embodiment, the description will not be repeated.

Next, a method for manufacturing the MOSFET 92 will be described. First, steps similar to those until FIG. 8 in the first embodiment are performed. After that, a step of forming the trench-bottom-surface protective layer 15 will be performed as follows.

Figure 15:
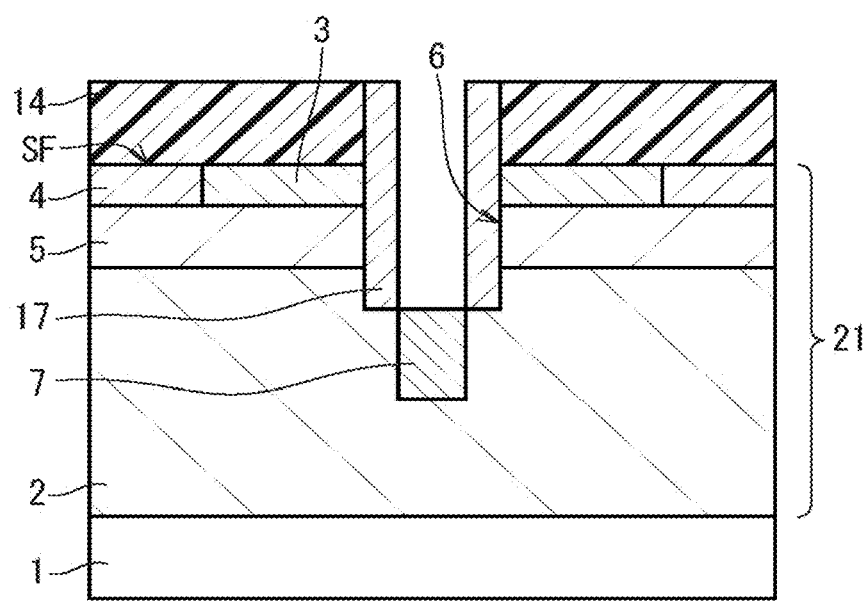
FIG. 15 is a cross-sectional view schematically showing one step in a method for manufacturing the silicon carbide semiconductor device in FIG. 14.

Referring to FIG. 15, a side wall mask 17 is formed on the side surface of the trench 6. An impurity to provide the p type is implanted into the bottom surface of the trench 6 through the trench 6 on which the side wall mask 17 is formed. By performing the ion implantation with the side wall mask 17 used as a mask, the low-concentration protective layer 7 having the width smaller than a width of the trench 6 is formed. After that, the side wall mask 17 is removed.

Referring to FIG. 14 again, an impurity to provide the p type is implanted into the bottom surface of the trench 6 without the side wall mask 17. Thus, the high-concentration protective layer 8 having the width corresponding to the width of the trench 6 is formed. According to this method, the width of the low-concentration protective layer 7 is smaller than the width of the high-concentration protective layer 8 by a thickness of the mask material in a lateral direction. The ion implantation without the side wall mask 17 may be performed before the side wall mask 17 is formed, instead of being performed after the side wall mask 17 has been removed as described above.

After that, through the almost similar steps in the first embodiment, the MOSFET 92 is obtained. According to this manufacturing method, as described above, the width of the high-concentration protective layer 8 and the width of the low-concentration protective layer 7 can be differentiated from each other.

Next, an effect in this embodiment will be described below.

The trench-bottom-surface protective layer 15c could cause the on-resistance to increase because it narrows the on-current pathway in the drift layer 2. According to this embodiment, since the width of the low-concentration protective layer 7 is small, the on-current pathway in the drift layer 2 can be prevented from being narrowed by the trench-bottom-surface protective layer 15 to some degree. Thus, the on-resistance increase due to the trench-bottom-surface protective layer 15 is suppressed.

In addition, not only the bottom surface of the low-concentration protective layer 7, but also the bottom surface of the corner part of the high-concentration protective layer 8 is exposed to the drift layer 2. Thus, the electric field concentration on the bottom surface of the trench-bottom-surface protective layer 15 in off state can be diffused to the concentration on the bottom surface of the low-concentration protective layer 7 and the concentration on the bottom surface of the high-concentration protective layer 8. Thus, the avalanche breakdown voltage is improved. Thus, the withstanding voltage can be further improved.

Third Embodiment

Figure 16:
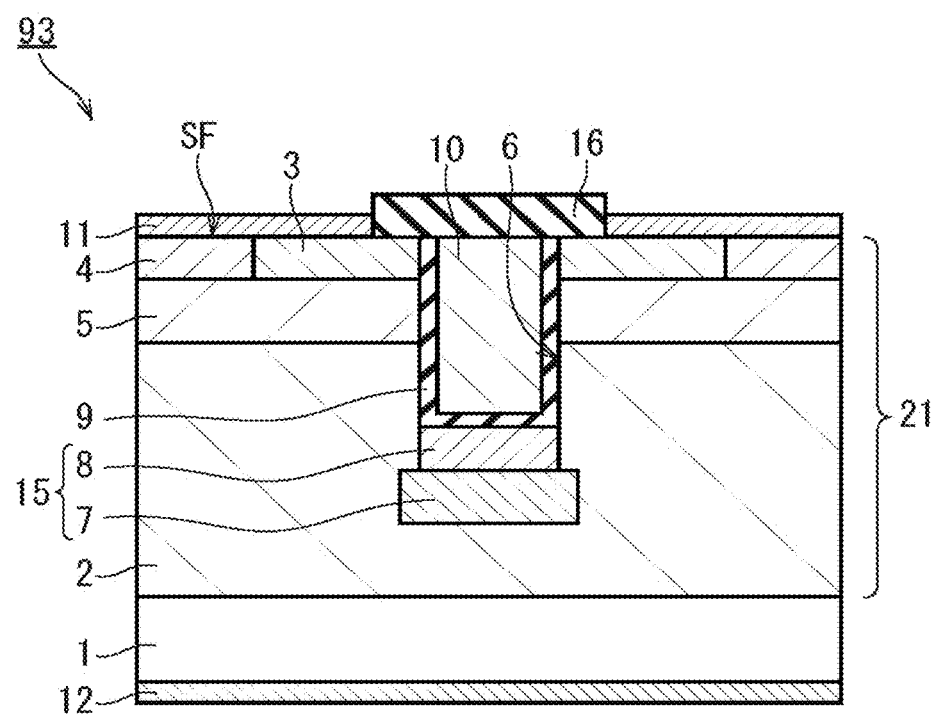
FIG. 16 is a partial cross-sectional view schematically showing a configuration of a silicon carbide semiconductor device in a third embodiment of the present invention.

FIG. 16 shows a schematic cross-sectional view of a cell configuration of an MOSFET 93 (silicon carbide semiconductor device) in this embodiment. In this embodiment, compared with the first embodiment, a configuration of the trench-bottom-surface protective layer 15 is different. Specifically, as for the trench-bottom-surface protective layer 15 of the MOSFET 93, a width of the low-concentration protective layer 7 is larger than a width of the high-concentration protective layer 8. Since the configuration other than the above is almost the same as the configuration, of the first embodiment, the description will not be repeated.

Next, a method for manufacturing the MOSFET 93 will be described below.

Figure 17:
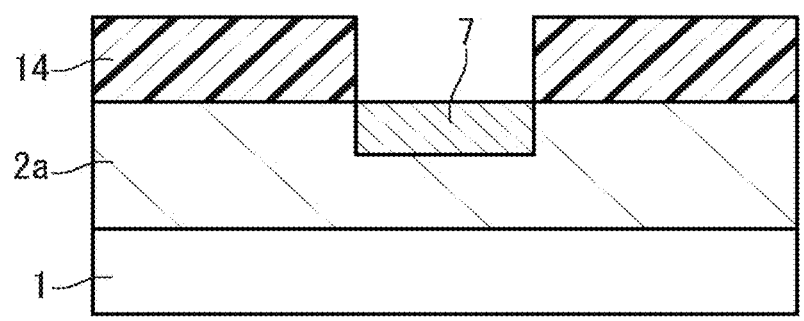
FIG. 17 is a partial cross-sectional view schematically showing a first step in a method for manufacturing the silicon carbide semiconductor device in FIG. 16.

Referring to FIG. 17, a first drift layer 2a (first layer) made of silicon carbide and having an n type is formed on the substrate 1. A method for forming the first drift layer 2a may be performed similarly to the method for forming the semiconductor layer 21 (FIG. 6). After that, a mask 14 having an opening to partially expose the first drift layer 2a is formed. Subsequently, with the mask 14, an impurity to provide a p type is implanted on the first drift layer 2a. Thus, the low-concentration protective layer 7 is formed on the first drift layer 2a. After that, the mask 14 is removed. Here, the low-concentration protective layer 7 may be formed on the first drift layer 2a by epitaxial growth, instead of the ion implantation.

Referring to FIG. 18, a second drift layer 2b is formed on the first drift layer 2a having the low-concentration protective layer 7. A method for forming the second drift layer 2b may be performed similarly to the method for forming the semiconductor layer 21 (FIG. 6). The second drift layer 2b is made of silicon carbide and has an n type similar to the first drift layer 2a and constitutes the drift layer 2 together with the first drift layer 2a. Thus, the low-concentration protective layer 7 is embedded in the drift layer 2 having the first drift layer 2a and the second drift layer 2b. By this embedding step, the low-concentration protective layer 7 having the width larger than the width of the trench 6 (FIG. 16) can be formed.

Referring to FIG. 19, the body region 5 is formed on the drift layer 2, and the source region 3 and the body contact region 4 are formed on the body region 5. In other words, the drift layer 2, the source region 3, the body contact region 4, and the body region 5 constitute the semiconductor layer 21 having the surface SF.

Referring to FIG. 20, the trench 6 is formed in the surface SF of the semiconductor layer 21 so as to penetrate the source region 3 and the body region 5 and reach the drift layer 2. The width of the trench 6 is smaller than the width of the low-concentration protective layer.

Referring to FIG. 21, the high-concentration protective layer 8 having the p type is formed by implanting an impurity to provide the p type into the bottom surface of the trench 6 through the trench 6. In other words, the high-concentration protective layer 8 is formed by self-alignment implantation using the trench 6. In addition, a width of the high-concentration protective layer 8 may be made smaller than the width of the trench 6 by using the side wall mask 17 (FIG. 15) in this implantation.

After that, through almost the similar steps shown in FIGS. 7, 8, and 10 in the first embodiment, the MOSFET 93 is obtained.

The method for forming the low-concentration protective layer 7 is not limited to the above-described one. For example, the low-concentration, protective layer 7 may be formed by ion implantation into a region deeper than the bottom surface of the trench 6 after the step shown in FIG. 8 in the first embodiment has been performed.

According to this embodiment, since the bottom surface of the low-concentration, protective layer 7 is large, a depletion layer is likely to spread from the low-concentration protective layer 7 in off state. Thus, the electric field strength in the drift layer 2 can be kept lower, so that the electric field strength to be applied to the vicinity of the bottom surface of the trench 6 can be reduced. Thus, the electric, field strength of the gate oxide film 9 can be reduced. As a result, the withstanding voltage can be further improved.

Fourth Embodiment

FIG. 22 shows a schematic cross-sectional view of a cell configuration of an MOSFET 94 (silicon carbide semiconductor device) in this embodiment. In this embodiment, compared with the first embodiment, a configuration of the trench-bottom-surface protective layer 15 is different. Specifically, the trench-bottom-surface protective layer 15 of the MOSFET 94 includes a low-concentration protective layer 20 (a second low-concentration protective layer). The low-concentration protective layer 20 is provided above the high-concentration protective layer 8. More specifically, the low-concentration protective layer 20 is provided between the high-concentration protective layer 8 and the bottom surface of the trench 6. Thus, according to this embodiment, the high-concentration protective layer 8 faces the bottom surface of the trench 6 across the low-concentration protective layer 20.

The low-concentration protective layer 20 is in contact with the bottom surface of the trench 6. The low-concentration protective layer 20 is positioned shallower than the high-concentration protective layer 8, in the trench-bottom-surface protective layer 15. The low-concentration protective layer 20 has an impurity concentration lower than the impurity concentration in any position of the high-concentration protective layer 8. In a case where the low-concentration protective layer 20 has an impurity concentration distribution, "the impurity concentration of the low-concentration protective layer 20" is defined by its maximum value. The impurity concentration of the low-concentration protective layer 7 and the impurity concentration of the low-concentration protective layer 20 may be equal to or different from each other. The low-concentration protective layer 20 preferably has a peak of the impurity concentration smaller than a peak in the high-concentration protective layer 8. Furthermore, in this embodiment, the high-concentration protective layer 8 is disposed so as to be in contact with the bottom surface of the low-concentration protective layer 20. Thus, the high-concentration protective layer 8 is separated from the bottom surface of the trench 6 by the low-concentration protective layer 20.

Since the configuration other than the above is almost the same as the configuration of the first embodiment, the description will not be repeated.

Next, a method for manufacturing the MOSFET 94 will be described below. First, steps similar to those until FIG. 8 in the first embodiment are performed. After that, by performing the method similar to that for forming the low-concentration protective layer 7 in FIG. 9, the low-concentration protective layer is formed at the bottom surface of the trench 6. After that, by ion implantation, the high-concentration protective layer 8 is formed in the region shallower than the bottom surface of the low-concentration protective layer and deeper than the bottom surface of the trench 6. In the low-concentration protective layer, the portion deeper than the high-concentration protective layer 8 serves as the low-concentration protective layer 7, and the portion shallower than that serves as the low-concentration protective layer 20. After that, through the steps similar to those in the first embodiment, the MOSFET 94 (FIG. 22) is obtained.

In addition, the low-concentration protective layer may be formed on the bottom of the trench 6 by epitaxial growth instead of the ion implantation. Furthermore, the low-concentration protective layer 7 and the low-concentration protective layer 20 may be formed separately. They may be separately formed by either the ion implantation or epitaxial growth. When the low-concentration protective layer 7 is formed by the ion implantation, it may be formed in a deeper region away front the bottom surface of the trench 6, or formed at the bottom surface of the trench 6. In the former case, a portion between the low-concentration protective layer 7 and the bottom surface of the trench 6 is to be used for the high-concentration protective layer 8 and also can be used for the low-concentration protective layer 20. In the latter case, the portions for the high-concentration protective layer 8 and the low-concentration protective layer 20 are formed on the low-concentration protective layer 7 by epitaxial growth.

Next, an effect of this embodiment will be described below.

The trench-bottom-surface protective layer 15c could cause the on-resistance to increase when it narrows the on-current pathway in the drift layer 2. Especially, in the case where the layer having the high impurity concentration is formed just below the bottom surface of the trench 6, the width of the depletion layer which spreads to the drift layer 2 slightly increases. In addition, in the case where this layer is formed by the ion implantation, an implantation region could expand, whereby the on-resistance could further increase. Meanwhile, according to this embodiment, since the low-concentration protective layer 20 is provided, the high-concentration protective layer 8 having the high impurity concentration is disposed away from the bottom surface of the trench 6. Thus, the on-resistance increase is alleviated.

Furthermore, in the case where the high-concentration protective layer 8 is formed at the bottom surface of the trench 6 by the ion implantation, many ions need to be implanted because the impurity concentration of the high-concentration protective layer 8 is high. As a result, many defects due to the implantation are formed in the high-concentration protective layer 8. Thus, it is difficult to directly form the high-quality gate oxide film 9 on the high-concentration protective layer 8 having the many defects. The fact that the quality of the gate oxide film 9 is low could cause a harmful effect on the withstanding voltage. Meanwhile, according to this embodiment, the high-concentration protective layer 8 which could have many defects is disposed away from the bottom surface of the trench 6. Thus, the reliability of the gate insulating film can be improved. Thus, the withstanding voltage can be further improved.

In addition, in the above each embodiment, as the silicon carbide semiconductor device, the MOSFET has been described, but the material of the gate oxide film is not limited to the oxide. That is, the silicon carbide semiconductor device may be an MISFET (Metal Insulator Semiconductor Field Effect Transistor) other than the MOSFET. Furthermore, the silicon carbide semiconductor device is not limited to the MISFET and may be an IGBT. The IGBT can be, for example, configured by changing the conductivity type of the substrate 1 from the n type to the p type. In this case, the source electrode 11 and the drain electrode 12 function as an emitter electrode and a collector electrode, respectively. In addition, in the above each embodiment, the first conductivity type is the n type and the second conductivity type is the p type, but they may be reversed.

In the present invention, the embodiments can be randomly combined, or each embodiment can be appropriately modified or omitted within the scope of the present invention. The present invention has been described in detail, but the above description is illustrative in every aspect, and the present invention is not limited to it. It is to be understood that numerous variations which have not been illustrated can be assumed without departing from the scope of the present invention.

REFERENCE SIGNS LIST

1: substrate (semiconductor substrate)
2: drift layer
2a: first drift layer
2b: second drift layer
3: source region
4: body contact region
5: body region
6: trench
7: low-concentration protective layer (first low-concentration protective layer)
8: high-concentration protective layer
9: gate oxide film (gate insulating film)
10: gate electrode
11: source electrode
12: drain electrode
13: end region
14: mask
15: french-bottom-surface protective layer
16: interlayer insulating film
17: side wall mask (mask)
20: low-concentration protective layer (second low-concentration protective layer)
21: semiconductor layer
91~94: MOSFET (silicon carbide semiconductor device)

The invention claimed is:

1. A silicon carbide semiconductor device comprising:
a drift layer of a first conductivity type, made of silicon carbide;
a body region of a second conductivity type, provided on said drift layer, the second conductivity type being different from the first conductivity type;
a source region of the first conductivity type, provided on said body region;
a source electrode connected to said source region;
a gate insulating film provided on a side surface and a bottom surface of a trench penetrating said body region and said source region;
a gate electrode provided in said trench with said gate insulating film interposed therebetween; and
a trench-bottom-surface protective layer of the second conductivity type, provided below the bottom surface of said trench in said drift layer and electrically connected to said source electrode, said trench-bottom-surface protective layer including
a high-concentration protective layer that is disposed below the body region, and
a first low-concentration protective layer provided below said high-concentration protective layer and having an impurity concentration lower than that of said high-concentration protective layer.

2. The silicon carbide semiconductor device according to claim 1, wherein
when it is assumed that $L_1$ represents a thickness of said first low-concentration protective layer, $L_2$ represents a thickness of said high-concentration protective layer, and $d_1$ represents a thickness of a depletion layer which extends from an interface between said first low-concentration protective layer and said drift layer to said trench-bottom-surface protective layer when a reverse voltage is applied to said silicon carbide semiconductor device, and when $d_2=\{-d_1\}$ is assumed, conditions $d_1 > L_1$, and $d_2 > 0$ are satisfied.

3. The silicon carbide semiconductor device according to claim 1, wherein
said high-concentration protective layer includes at least one region in which an impurity concentration is constant in a depth direction, and said first low-concentration protective layer includes at least one region in which an impurity concentration is smaller than that of said high-concentration protective layer and constant in a depth direction.

4. The silicon carbide semiconductor device according to claim 1, wherein
said high-concentration protective layer has a mountain-shaped peak of the impurity concentration in the depth direction, and said first low-concentration protective layer has a mountain-shaped peak of the impurity concentration smaller than said mountain-shaped peak of said high-concentration protective layer, in the depth direction.

5. The silicon carbide semiconductor device according to claim 1, wherein
an impurity concentration profile of said first low-concentration protective layer includes at least one portion in which a magnitude of a gradient of the profile increases toward the depth direction.

6. The silicon carbide semiconductor device according to claim 1, wherein
the impurity concentration of said high-concentration protective layer is more than or equal to twice as high as the impurity concentration of said first low-concentration protective layer.

7. The silicon carbide semiconductor device according to claim 1, wherein
a width of said first low-concentration protective layer is smaller than a width of said high-concentration protective layer.

8. The silicon carbide semiconductor device according to claim 1, wherein
a width of said first low-concentration protective layer is larger than a width of said high-concentration protective layer.

9. The silicon carbide semiconductor device according to claim 1, wherein
said trench-bottom-surface protective layer is composed of two layers of said high-concentration protective layer and said first low-concentration protective layer.

10. The silicon carbide semiconductor device according to claim 1, wherein
said trench-bottom-surface protective layer includes a second low-concentration protective layer provided above said high-concentration protective layer and having an impurity concentration lower than the impurity concentration of said high-concentration protective layer.

11. The silicon carbide semiconductor device according to claim 10, wherein
said second low-concentration protective layer has a peak of the impurity concentration smaller than a peak in said high-concentration protective layer.

12. A method for manufacturing a silicon carbide semiconductor device comprising the steps of:
preparing a semiconductor substrate provided with a drift layer of a first conductivity type, said drift layer being made of silicon carbide;
forming a body region of a second conductivity type on said drift layer, the second conductivity type being different from the first conductivity type;
forming a source region of the first conductivity type on a surface of said body region;
forming a trench penetrating said body region from a surface of said source region; and
forming, at a bottom surface of said trench, a high-concentration protective layer of the second conductivity type that is disposed below the body region and a first low-concentration protective layer of the second conductivity type below said high-concentration protective layer by performing ion implantations a plurality of times with different acceleration energies, said first low-concentration protective layer having an impurity concentration lower than an impurity concentration of said high-concentration protective layer.

13. A method for manufacturing a silicon carbide semiconductor device comprising the steps of:
preparing a semiconductor substrate provided with a drift layer of a first conductivity type, said drift layer being made of silicon carbide;
forming a body region of a second conductivity type on said drift layer, the second conductivity type being different from the first conductivity type;
forming a source region of the first conductivity type on a surface of said body region;
forming a trench penetrating said body region from a surface of said source region;
forming a first low-concentration protective layer of the second conductivity type on a bottom surface of said trench by epitaxial growth, and
forming a high-concentration protective layer of the second conductivity type having an impurity concentration higher than an impurity concentration of said first low-concentration protective layer on an upper surface of said first low-concentration protective layer by epitaxial growth and disposed below the body region.

* * * * *